US011043271B2

(12) United States Patent
Shukla et al.

(10) Patent No.: US 11,043,271 B2
(45) Date of Patent: Jun. 22, 2021

(54) REUSING A CELL BLOCK FOR HYBRID DUAL WRITE

(71) Applicant: Western Digital Technologies, Inc., San Jose, CA (US)

(72) Inventors: Arun Kumar Shukla, Bangalore (IN); Sharad Gupta, Bangalore (IN); Silky Mohanty, Bhubaneswar (IN); Athira Kanchiyil, Bangalore (IN); Arunkumar Mani, Thirunelveli (IN); Noor Mohamed, Thanjavur (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 133 days.

(21) Appl. No.: 15/885,760

(22) Filed: Jan. 31, 2018

(65) Prior Publication Data

US 2019/0164598 A1    May 30, 2019

(30) Foreign Application Priority Data

Nov. 29, 2017  (IN) .............................. 201741042793

(51) Int. Cl.
*G11C 16/10* (2006.01)
*G06F 3/06* (2006.01)
(Continued)

(52) U.S. Cl.
CPC ............ *G11C 16/10* (2013.01); *G06F 3/0604* (2013.01); *G06F 3/065* (2013.01); *G06F 3/0631* (2013.01);
(Continued)

(58) Field of Classification Search
CPC ....... G11C 29/52; G11C 5/148; G11C 7/1015; G11C 11/56; G06F 12/0223;
(Continued)

(56) References Cited

U.S. PATENT DOCUMENTS 7,492,368 B1   2/2009  Nordquist et al.
7,630,252 B2  12/2009  Lin
(Continued)

OTHER PUBLICATIONS

"Whatt is ECC memory" posted to https://www.crucial.com/USA/en/memory-server-ecc and archived Mar. 7, 2015 by archive.org (Year: 2015).*

(Continued)

*Primary Examiner* — William E. Baughman
*Assistant Examiner* — Janice M. Girouard
(74) *Attorney, Agent, or Firm* — Kunzler Bean & Adamson, PC

(57) ABSTRACT

Apparatuses, systems, methods, and computer program products are disclosed for hybrid dual write. An apparatus includes a memory device comprising a plurality of single level cell blocks and a plurality of multi level cell blocks. An apparatus includes a hybrid writing component. A hybrid writing component includes a single level writing circuit that writes data to a plurality of single level cell blocks. A hybrid writing component includes a multi level writing circuit that copies data from a plurality of single level cell blocks to a plurality of multi level cell blocks. A hybrid writing component includes a control circuit that controls data to be copied from a single level cell block of a plurality of single level cell blocks to at least two multi level cell blocks of a plurality of multi level cell blocks.

20 Claims, 13 Drawing Sheets

(51) Int. Cl.
    *G11C 7/10*       (2006.01)
    *G11C 11/56*     (2006.01)
    *G11C 5/14*       (2006.01)
    *G06F 12/02*     (2006.01)
    *G11C 29/52*     (2006.01)
    *G11C 29/04*     (2006.01)

(52) U.S. Cl.
    CPC .......... *G06F 3/0644* (2013.01); *G06F 3/0647* (2013.01); *G06F 3/0659* (2013.01); *G06F 3/0679* (2013.01); *G11C 5/148* (2013.01); *G11C 7/1015* (2013.01); *G11C 11/56* (2013.01); *G06F 12/0223* (2013.01); *G06F 2212/205* (2013.01); *G11C 11/5628* (2013.01); *G11C 29/04* (2013.01); *G11C 29/52* (2013.01); *G11C 2211/5641* (2013.01)

(58) Field of Classification Search
    CPC ............. G06F 2212/205; G06F 3/0604; G06F 3/0631; G06F 3/0644; G06F 3/065; G06F 3/0659; G06F 3/0679
    See application file for complete search history.

(56) References Cited

U.S. PATENT DOCUMENTS

| | | | |
|---|---|---|---|
| 9,933,963 B1* | 4/2018 | Alhussien | G06F 3/0619 |
| 10,732,838 B2 | 8/2020 | Shukla et al. | |
| 2003/0002376 A1* | 1/2003 | Beat | G11C 7/1006 |
| | | | 365/230.03 |
| 2006/0136656 A1 | 6/2006 | Conley et al. | |
| 2009/0132770 A1 | 5/2009 | Lin | |
| 2009/0172247 A1 | 7/2009 | Bar-or et al. | |
| 2010/0211737 A1* | 8/2010 | Flynn | G06F 12/0246 |
| | | | 711/114 |
| 2014/0189207 A1* | 7/2014 | Sinclair | G06F 12/0253 |
| | | | 711/103 |
| 2015/0154110 A1 | 6/2015 | Wu et al. | |
| 2016/0054931 A1 | 2/2016 | Romanovsky et al. | |
| 2016/0094339 A1 | 3/2016 | Agarwal et al. | |
| 2016/0147671 A1 | 5/2016 | Vishne et al. | |
| 2017/0102991 A1* | 4/2017 | Haratsch | H03M 13/3707 |
| 2017/0177236 A1 | 6/2017 | Haratsch et al. | |
| 2017/0315908 A1* | 11/2017 | Yang | G11C 16/10 |
| 2018/0121128 A1* | 5/2018 | Doyle | G06F 3/064 |
| 2018/0143876 A1* | 5/2018 | Yang | G06F 11/1072 |
| 2018/0217751 A1* | 8/2018 | Agarwal | G11C 16/3422 |
| 2018/0285258 A1* | 10/2018 | Muchherla | G06F 12/0246 |
| 2019/0056989 A1* | 2/2019 | Srinivasan | G06F 11/1012 |
| 2019/0163369 A1 | 5/2019 | Mohamed et al. | |
| 2019/0163386 A1 | 5/2019 | Shukla et al. | |
| 2019/0164598 A1 | 5/2019 | Shukla et al. | |

OTHER PUBLICATIONS

U.S. Appl. No. 15/885,767 (2380.2.347US3), Office Action, dated Apr. 12, 2019.

Mingming Cao et al., "Ext:4: The Next Generation of Ext2/3 Filesystem", 2007 IBM Corporation, pp. 1-36.

U.S. Appl. No. 15/885,767 (2380.2.347US3), Notice of Allowance, dated Sep. 25, 2019.

U.S. Appl. No. 151/885,765 (2380.2.347US2), Office Action, dated Apr. 15, 2019.

U.S. Appl. No. 15/885,765 (2380.2.347US2), Final Office Action, dated Sep. 27, 2019.

U.S. Appl. No. 15/885,765, Notice of Allowance dated Apr. 1, 2021.

* cited by examiner

REUSING A CELL BLOCK FOR HYBRID DUAL WRITE

CROSS-REFERENCE TO RELATED APPLICATIONS

This application claims priority to Indian Provisional Patent Application Number 201741042793 entitled "HYBRID DUAL WRITE" and filed on Nov. 29, 2017 for Arun Kumar Shukla, et al., which is incorporated herein by reference in its entirety.

TECHNICAL FIELD

The present disclosure, in various embodiments, relates to memory die and more particularly relates to using hybrid dual write to write data on memory die.

BACKGROUND

Many electrical circuits and devices, such as data storage devices or the like, include memory die. Memory die may be used to store data. Data may be written to memory die using a variety of methods.

SUMMARY

Apparatuses are presented for hybrid dual write. In one embodiment, an apparatus includes a memory device comprising a plurality of single level cell blocks and a plurality of multi level cell blocks. An apparatus, in certain embodiments, includes a hybrid writing component. A hybrid writing component, in some embodiments, includes a single level writing circuit that writes data to a plurality of single level cell blocks. In one embodiment, a hybrid writing component includes a multi level writing circuit that copies data from a plurality of single level cell blocks to a plurality of multi level cell blocks. In some embodiments, a hybrid writing component includes a control circuit that controls data to be copied from a single level cell block of a plurality of single level cell blocks to at least two multi level cell blocks of a plurality of multi level cell blocks.

Methods are presented for hybrid dual write. A method, in one embodiment, includes writing a first set of data to a first set of single level cell blocks. In various embodiments, a method includes copying a first set of data from a first set of single level cell blocks to a first multi level cell block. In some embodiments, a method includes writing a second set of data to a second set of single level cell blocks. In certain embodiments, a method includes copying a second set of data from a second set of single level cell blocks to a second multi level cell block. In one embodiment, a first set of single level cell blocks and a second set of single level cell blocks share a common single level cell block.

An apparatus for hybrid dual write, in one embodiment, includes means for storing data in a plurality of single level cell blocks. In some embodiments, an apparatus includes means for copying data from a plurality of single level cell blocks to a multi level cell block. In various embodiments, a single level cell block of a plurality of single level cell blocks is configured to store data to be copied to another multi level cell block concurrently with data to be copied to a multi level cell block.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
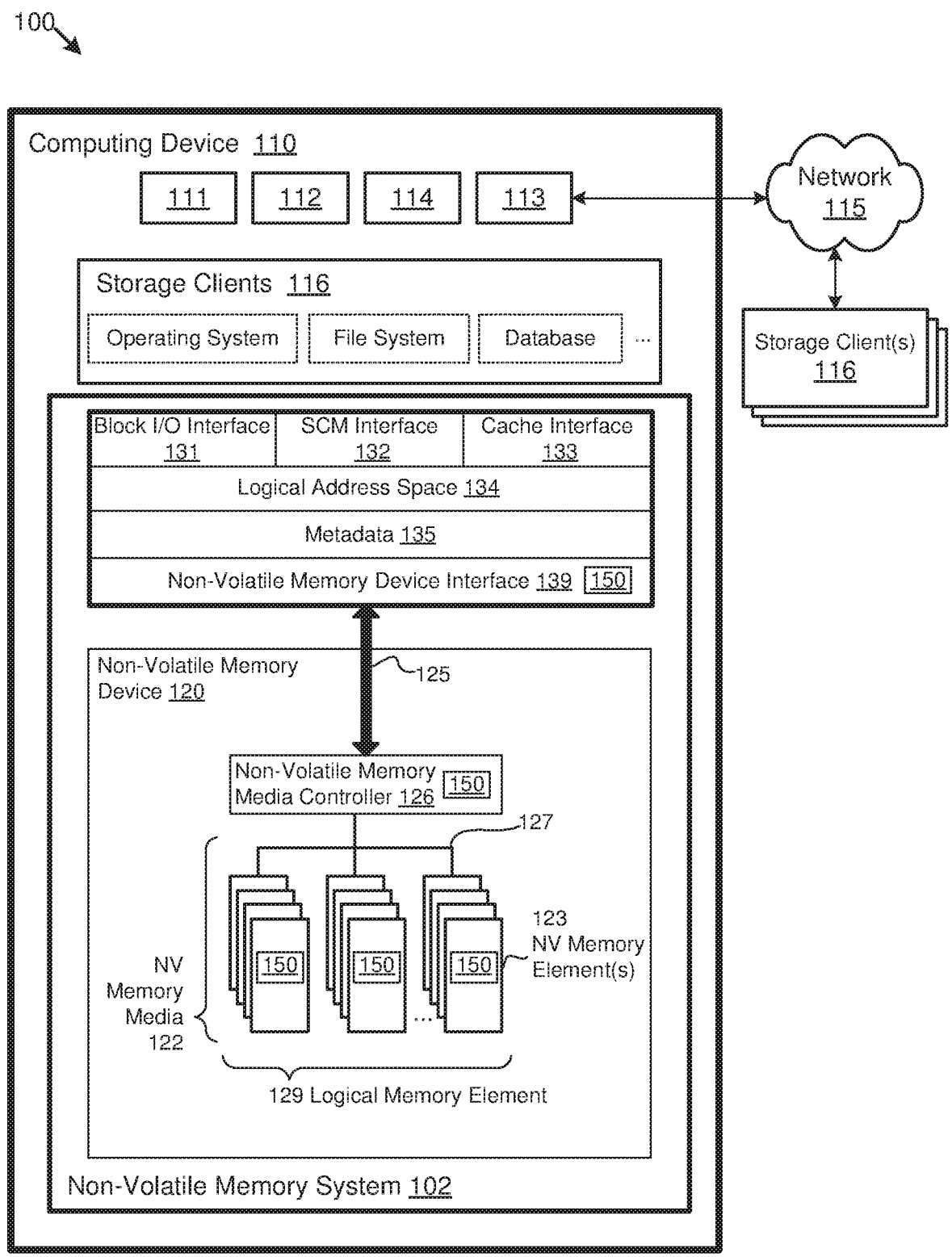
FIG. 1A is a schematic block diagram illustrating one embodiment of a system for hybrid dual write.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising a hybrid writing component 150 for a non-volatile memory device 120. The hybrid writing component 150 may be part of and/or in communication with a non-volatile memory media controller 126, a non-volatile memory element 123, a device driver, or the like. The hybrid writing component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more non-volatile DIMM (NVDIMM) cards, one or more persistent NVDIMM (NVDIMM-P) cards, one or more cache coherent interconnect for accelerators (CCIX) cards, one or more Gen-Z cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the hybrid writing component 150 may be embodied as one or more computer readable instructions stored on the non-transitory storage medium 114.

The non-volatile memory system 102, in the depicted embodiment, includes a hybrid writing component 150. The hybrid writing component 150, in one embodiment, writes data to a plurality of single level cell blocks. The hybrid writing component 150, in certain embodiments, may copy data from a plurality of single level cell blocks to a plurality of multi level cell blocks. The hybrid writing component 150 may also control data to be copied from a single level cell block of a plurality of single level cell blocks to at least two multi level cell blocks of a plurality of multi level cell blocks. By one single level cell block being used for copying data to multiple multi level cell blocks, a number of programming and/or erase cycles for the single level cell block may be reduced.

The hybrid writing component 150, in some embodiments, allocates a single level cell block of a plurality of single level cell blocks to a first stream in response to a multi level cell block of a plurality of multi level cell block being allocated to the first stream. By allocating the single level cell block to the first stream, replay may be accomplished in response to a power cycle.

In some embodiments, the non-volatile memory device 120 may include one or more single level cell blocks and/or one or more multi level cell blocks. Moreover, a single level cell block may include one or more single level cells. Furthermore, a multi level cell block may include one or more multi level cells. As used herein, a single level cell (SLC) may refer to a memory cell that is used to store a single bit of data per memory cell. In addition, as used herein, a multi level cell (MLC) may refer to a memory cell that is used to store multiple bits of data per memory cell (e.g., at least two bits of data per memory cell).

The hybrid writing component 150, in certain embodiments, directs a single level writing circuit to write data corresponding to a first logical group to a set of single level cell blocks of a plurality of single level cell blocks. In various embodiments, in response to a multi level writing circuit copying data from a set of single level cell blocks to a plurality of multi level cell blocks, a first portion of data from the set of single level cell blocks remains uncopied because the first portion of data is insufficient to fill an entire multi level cell block. Accordingly, a multi level cell block may include data from more than one logical group.

In one embodiment, the hybrid writing component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the hybrid writing component 150 may comprise executable software code, such as a device driver or the like, stored on the computer readable storage medium 114 for execution on the processor 111. In a further embodiment, the hybrid writing component 150 may include a combination of both executable software code and logic hardware.

In one embodiment, the hybrid writing component 150 is configured to receive storage requests from a device driver or other executable application via a bus 125 or the like. The hybrid writing component 150 may be further configured to transfer data to/from a device driver and/or storage clients 116 via the bus 125. Accordingly, the hybrid writing component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the hybrid writing component 150 may receive storage requests as an API call from a storage client 116, as an IO-CTL command, or the like.

According to various embodiments, a non-volatile memory controller 126 in communication with one or more stripe placement components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM) and/or persistent memory.

While legacy technologies such as NAND flash may be block and/or page addressable, storage class memory, in one embodiment, is byte addressable. In further embodiments, storage class memory may be faster and/or have a longer life (e.g., endurance) than NAND flash; may have random write access instead of or in addition to the sequential programming of NAND flash (e.g., allowing write-in-place programming of data); may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129 (e.g., logical group). The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
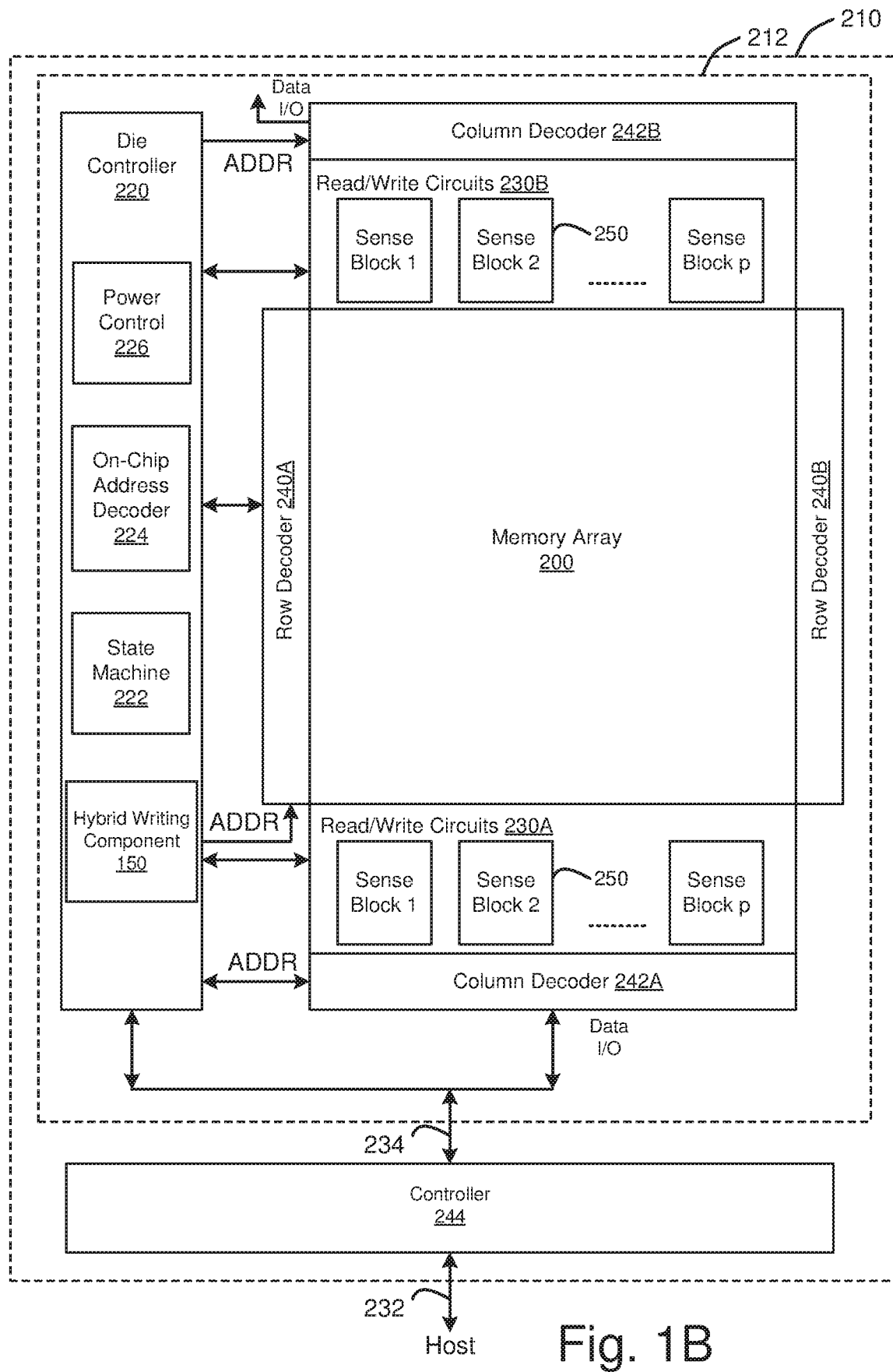
FIG. 1B is a schematic block diagram illustrating another embodiment of a system for hybrid dual write.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a hybrid writing component 150, a state machine 222, and an on-chip address decoder 224. In one embodiment, the state machine 222 comprises at least a portion of the hybrid writing component 150. In a further embodiment, the controller 244 comprises at least a portion of the hybrid writing component 150. In various embodiments, one or more of the sense blocks 250 comprises at least a portion of the hybrid writing component 150.

The hybrid writing component 150, in one embodiment, is configured to write a first set of data to a first set of single level cell blocks, copy the first set of data from the first set of single level cell blocks to a first multi level cell block, write a second set of data to a second set of single level cell blocks, and copy the second set of data from the second set of single level cell blocks to a second multi level cell block. In certain embodiments, the first set of single level cell blocks and the second set of single level cell blocks share a common single level cell block.

The hybrid writing component 150, in various embodiments, is configured to write information to a master index, wherein the information indicates allocation of a first multi level cell block of a storage device and a first single level cell block of the storage device to a first data stream, read the information from the master index in response to detecting a power cycle event of the storage device occurring, and replay storage events that occur between writing the information to the master index and the power cycle event to put the storage device into a state the storage device was in at a time the power cycle event occurred.

The hybrid writing component 150, in some embodiments, is configured to write data corresponding to a set of single level cell blocks, copy a first portion of the data from the set of single level cell blocks to one or more multi level cell blocks, and determine that a second portion of the data from the set of single level cell blocks remains uncopied to the one or more multi level cell blocks because the second portion of the data is insufficient to fill an entire multi level cell block.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the hybrid writing component 150. The hybrid writing component 150, in certain embodiments, is embodied as software in a device driver, hardware in a device controller 244, and/or hardware in a die controller 220 and/or state machine 222.

In one embodiment, one or any combination of die controller 220, hybrid writing component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
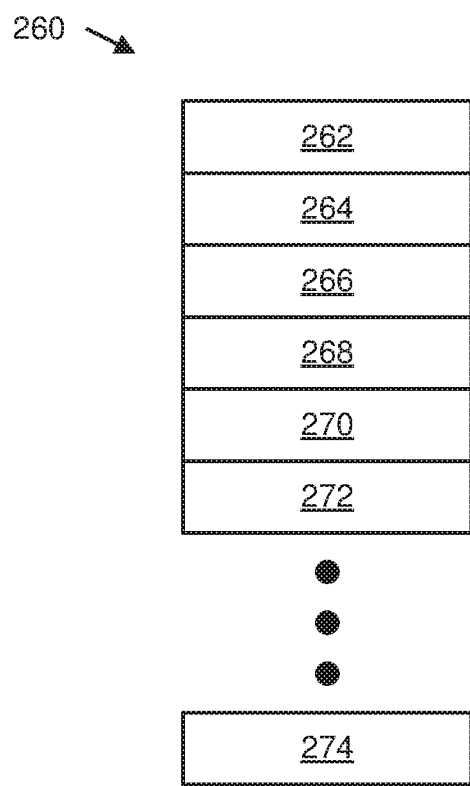
FIG. 2 is a schematic block diagram illustrating one embodiment of a single level cell block.

FIG. 2 is a schematic block diagram illustrating one embodiment of a single level cell block 260. In the illustrated embodiment, the single level cell block 260 includes a first wordline 262, a second wordline 264, a third wordline 266, a fourth wordline 268, a fifth wordline 270, a sixth wordline 272, and an nth wordline 274. As may be appreciated, any number of wordlines may be between the sixth wordline 272 and the nth wordline 274. Accordingly, the single level cell block 260 may have any suitable number of wordlines. In one embodiment, the single level cell block 260 includes 16 wordlines, 32 wordlines, 64 wordlines, 128 wordlines, 256 wordlines, and so forth. In various embodiments, each wordline may correspond to a number of strings, such as 1, 2, 4, 8, 16, and so forth. For example, in one embodiment, the single level cell block 260 includes 64 wordlines, with each wordline corresponding to 4 strings for a total of 256 pages (e.g., 64 wordlines×4 strings=256 pages). In some embodiments, the first wordline 262, the second wordline 264, the third wordline 266, and the fourth wordline 268 may not be used to store data. In such embodiments, the single level cell block 260 is used in a shifted manner to inhibit memory errors. Therefore, in such embodiments, if the single level cell block 260 includes 64 total wordlines with each wordline corresponding to 4 strings, a total of 240 pages are available for storing data (e.g., 60 wordlines×4 strings=240 pages).

Figure 3:
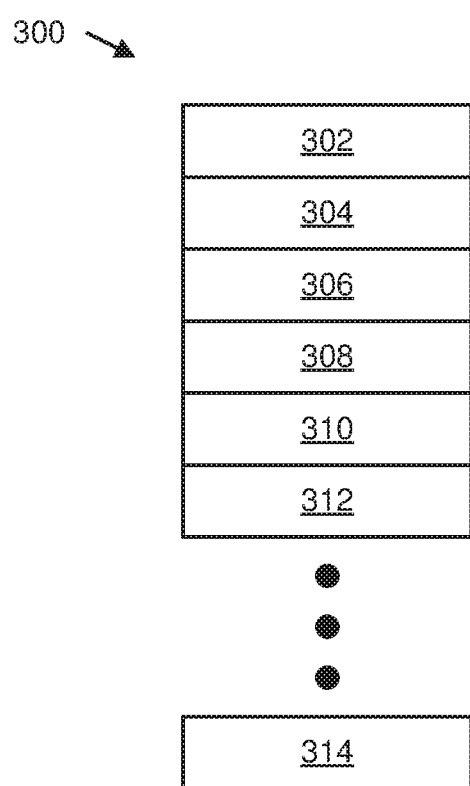
FIG. 3 is a schematic block diagram illustrating one embodiment of a multi level cell block.

FIG. 3 is a schematic block diagram illustrating one embodiment of a multi level cell block 300. In the illustrated embodiment, the multi level cell block 300 includes a first wordline 302, a second wordline 304, a third wordline 306, a fourth wordline 308, a fifth wordline 310, a sixth wordline 312, and an nth wordline 314. As may be appreciated, any number of wordlines may be between the sixth wordline 312 and the nth wordline 314. Accordingly, the multi level cell block 300 may have any suitable number of wordlines. In one embodiment, the multi level cell block 300 includes 16 wordlines, 32 wordlines, 64 wordlines, 128 wordlines, 256 wordlines, and so forth. In various embodiments, each wordline may correspond to a number of strings, such as 1, 2, 4, 8, 16, and so forth. For example, in one embodiment, the multi level cell block 300 includes 64 wordlines, with each wordline corresponding to 4 strings for a total of 256 pages (e.g., 64 wordlines×4 strings=256 pages). In certain embodiments, all wordlines of the multi level cell block 300 may be used to store data.

In some embodiments, data may be first stored in single level cell blocks (e.g., single level cell block 260). In response to sufficient data being stored in single level cell blocks, the data in the single level cell blocks may be copied to multi level cell blocks (e.g., multi level cell block 300). In various embodiments, each multi level cell may be used to store three single level cells. Accordingly, in embodiments in which entire single level cell blocks are used to store data, three single level cell blocks may be copied into one multi level cell block. For example, one single level cell block may be copied into a lower page of the multi level cell block, one single level cell block may be copied into a middle page of the multi level cell block, and one single level cell block may be copied into an upper page of the multi level cell block. In some embodiments a first data latch (ADL), a second data latch (BDL), and a third data latch (CDL) may hold lower page data, middle page data, and upper page data for one MLC program of the multi level cell block. The data in single level cell blocks may be held there as a temporary backup to a multi level cell block into which the data is copied until the multi level cell block passes one or more tests, such as enhanced post write read (EPWR) checks. After the multi level cell block passes the one or more tests, the single level cell blocks may be reused for storing additional data.

Figure 4:
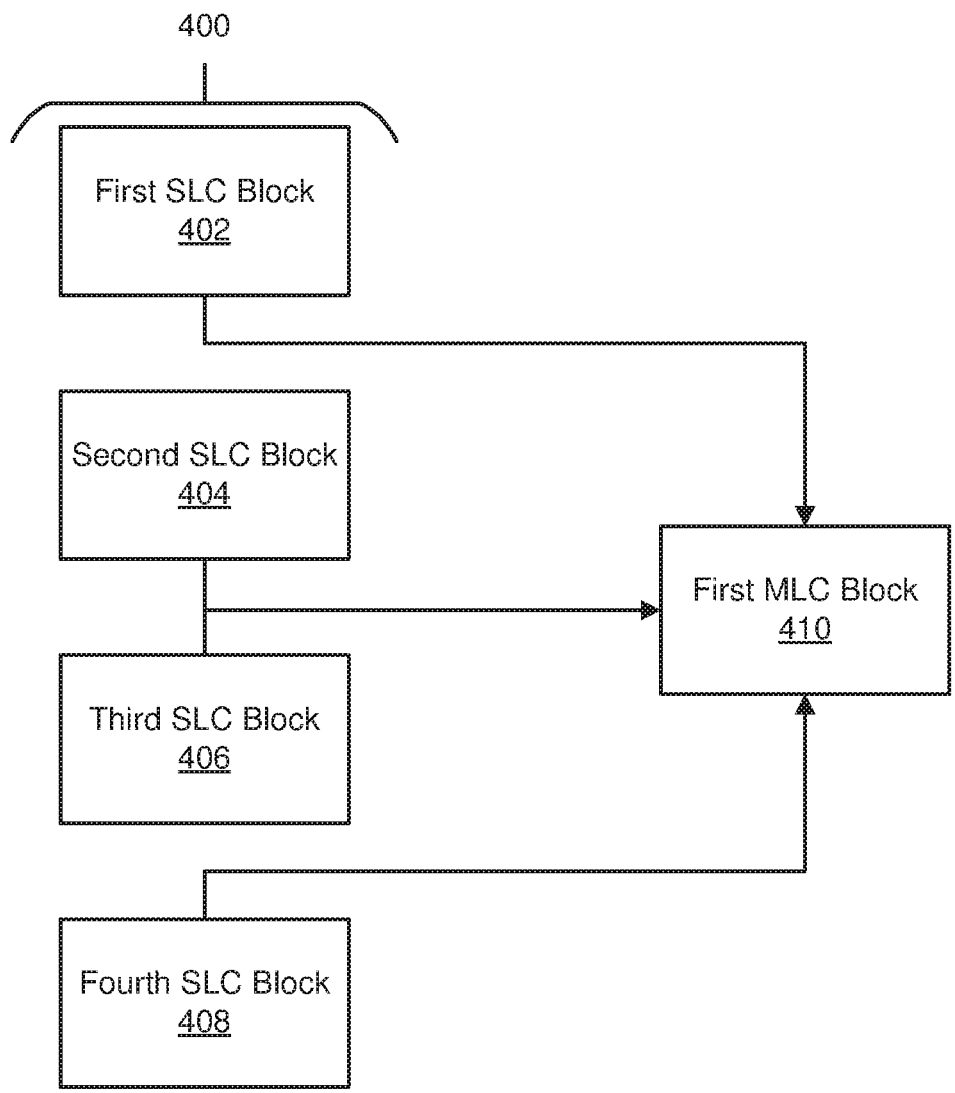
FIG. 4 is a schematic block diagram of a set of single level cell blocks used to store data for a multi level cell block.

FIG. 4 is a schematic block diagram of a set of single level cell blocks 400 used to store data for a multi level cell block. The set of single level cell blocks 400 includes a first SLC block 402, a second SLC block 404, a third SLC block 406, and a fourth SLC block 408. Data from the set of single level cell blocks 400 is copied to a first MLC block 410. Specifically, each of the first SLC block 402, the second SLC block 404, the third SLC block 406, and the fourth SLC block 408 uses only 240 pages out of 256 available pages. Thus, to fill the first MLC block 410, the 240 available pages from the first SLC block 402, the 240 available pages from the second SLC block 404, the 240 available pages from the third SLC block 406, and 48 available pages from the fourth SLC block 408 are used. Accordingly, only ⅕ of the available pages in the fourth SLC block 408 are used (e.g., 48 out of 240 available pages). If the remaining ⅘ of the available pages in the fourth SLC block 408 are unused, the set of SLC blocks 400 may have a number of program and/or erase cycles that exceeds a predetermined threshold number of cycles in comparison to a number of program and/or erase cycles for the first MLC block 410. In certain embodiments, the predetermined threshold number of cycles for an SLC block may be 50, 75, or 100 times the number of program and/or erase cycles for an MLC block. In other embodiments, the predetermined threshold number of cycles may be any suitable value.

Figure 5:
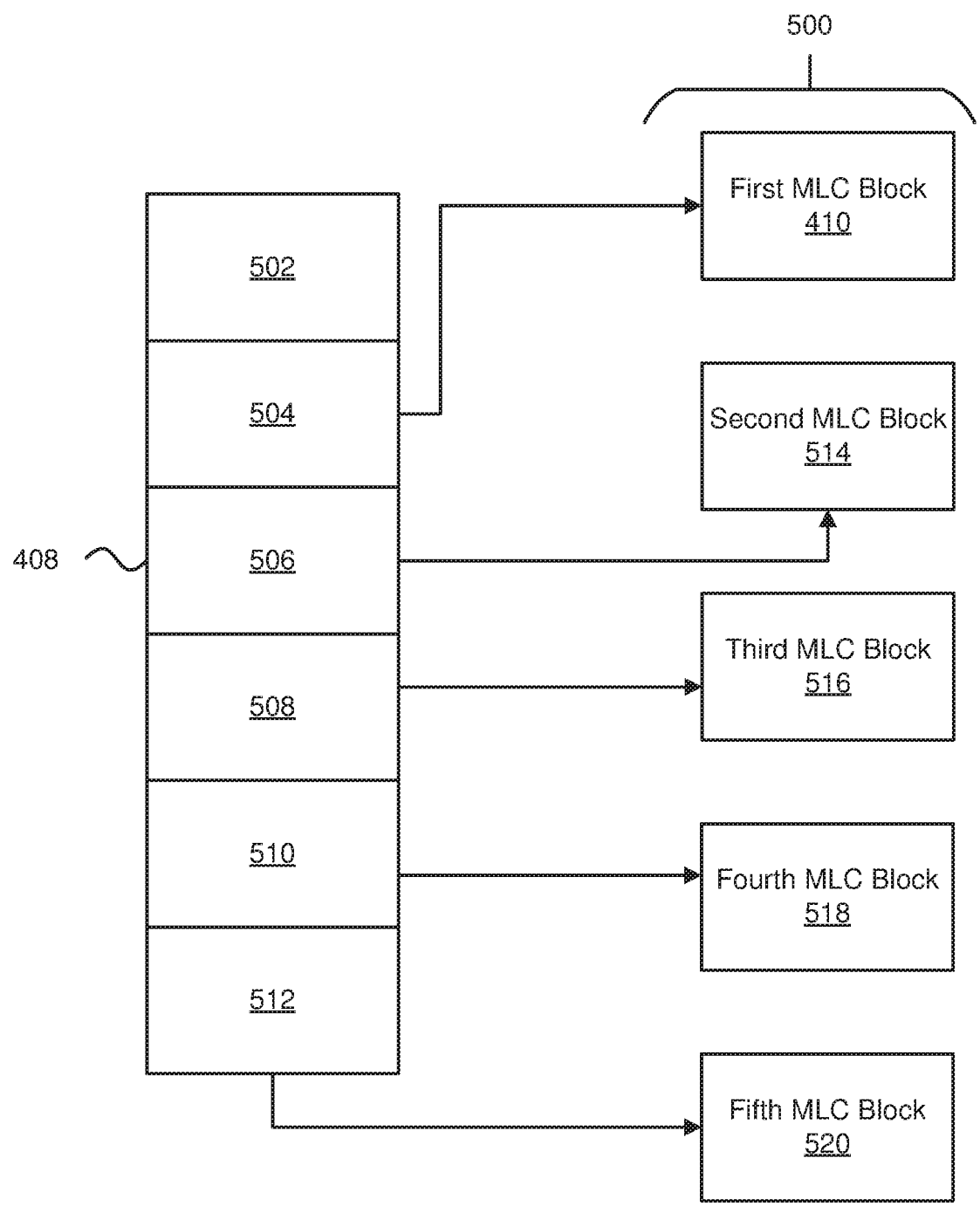
FIG. 5 is a schematic block diagram of a single level cell block used to store data for multiple multi level cell blocks.

FIG. 5 is a schematic block diagram of a single level cell block used to store data for multiple multi level cell blocks. As illustrated, the fourth SLC block 408 is used to store data for a set of MLC blocks 500 to reduce unused available pages in the fourth SLC block 408. By reducing the number of unused available pages in the fourth SLC block 408, a number of program and/or erase cycles for the fourth SLC block 408 may be reduced so that the number of program and/or erase cycles for the fourth SLC block 408 does not exceed a predetermined threshold number of cycles in comparison to a number of program and/or erase cycles for the set of MLC blocks 500.

Specifically, the fourth SLC block 408 may include an unavailable portion 502 that is not used to store data (e.g., 4 wordlines×4 strings=16 pages), a first data portion 504, a second data portion 506, a third data portion 508, a fourth data portion 510, and a fifth data portion 512. In certain embodiments, each of the first data portion 504, the second data portion 506, the third data portion 508, the fourth data portion 510, and the fifth data portion 512 may be the same size (e.g., 12 wordlines×4 strings=48 pages). In the illustrated embodiment, data stored in the first data portion 504 is copied to the first MLC block 410, the second data portion 506 is copied to a second MLC block 514, the third data portion 508 is copied to a third MLC block 516, the fourth data portion 510 is copied to a fourth MLC block 518, and the fifth data portion 512 is copied to a fifth MLC block 520. Thus, the fourth SLC block 408 may be used to store a portion of data for five MLC blocks. As may be appreciated, the portion of data for the five MLC blocks may be a data portion that exceeds three separate SLC blocks for each MLC block. By using the fourth SLC block 408 in this manner, a number of SLC blocks used per MLC block may be reduced, endurance of the SLC blocks may be improved by reducing the number of program and/or erase cycles, endurance of the SLC blocks may be improved without using additional SLC blocks, product life of the SLC blocks may be increased, and/or performance may be improved because of fewer program and/or erase cycles.

In certain embodiments, a master index page (MIP) may be used to store information corresponding to allocation of data streams to SLC blocks and/or MLC blocks. In such embodiments, the MIP may record four SLC blocks corresponding to one MLC block for a particular data stream. Moreover, during a replay, in response to detecting that four SLC blocks are allocated to a particular data stream, a new SLC block may not be allocated from a first-in first-out (FIFO) buffer. As used herein, a replay may be a series of actions that are completed after a power cycle of a storage device to put the storage device back into a state it was in before the power cycle of the storage device occurred.

Figure 6:
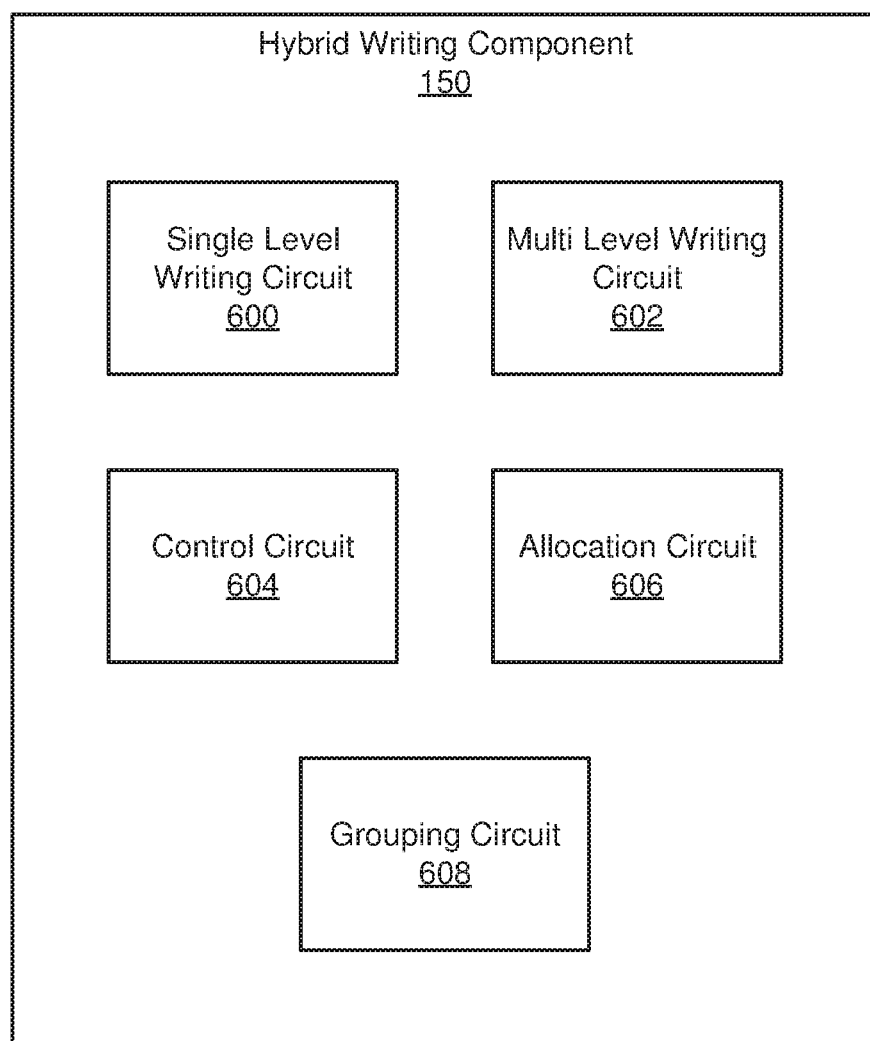
FIG. 6 is a schematic block diagram illustrating one embodiment of a hybrid writing component.

FIG. 6 depicts one embodiment of a hybrid writing component 150. The hybrid writing component 150 may be substantially similar to the hybrid writing component 150 described above with regard to FIGS. 1A and/or 1B. In general, as described above, the hybrid writing component 150 writes data to a plurality of single level cell blocks, copies the data from the plurality of single level cell blocks to a plurality of multi level cell blocks, controls data to be copied from a single level cell block of the plurality of single level cell blocks to at least two multi level cell blocks of the plurality of multi level cell blocks, allocates a single level cell block of the plurality of single level cell blocks to a first stream in response to a multi level cell block of the plurality of multi level cell block being allocated to the first stream, and/or directs the single level writing circuit to write data corresponding to a first logical group to a set of single level cell blocks of the plurality of single level cell blocks. Accordingly, the hybrid writing component 150 may facilitate writing data in a hybrid dual write environment that uses a combination of SLC blocks and MLC blocks. In the depicted embodiment, the hybrid writing component 150 includes a single level writing circuit 600, a multi level writing circuit 602, a control circuit 604, an allocation circuit 606, and a grouping circuit 608.

In one embodiment, the single level writing circuit 600 writes data to one or more SLC blocks. In certain embodiments, the single level writing circuit 600 may use one or more buffers for writing data from an incoming data stream to the one or more SLC blocks. One embodiment for writing data to one or more SLC blocks using buffers is described in relation to FIG. 9. In various embodiments, the single level writing circuit 600 writes data for one MLC block to four SLC blocks as described in relation to FIG. 4. In such embodiments, the four SLC blocks may include one SLC block that is used to store shared data for multiple MLC blocks as described in relation to FIG. 5. Moreover, as described in relation to FIG. 2, a portion of each SLC block may be unavailable for storing data. For example, in one embodiment, the portion may include 16 pages.

In certain embodiments, the multi level writing circuit 602 copies data from multiple SLC blocks to multiple MLC blocks. In such embodiments, the multi level writing circuit 602 may copy data as described in relation to FIGS. 4 and/or 5. For example, in one embodiment, the multi level writing circuit 602 may copy data from three SLC blocks entirely (e.g., the entire data stored by portions of the three SLC blocks available to store data) to one MLC block.

In some embodiments, the control circuit 604 controls data to be copied from an SLC block to at least two MLC blocks. In one embodiment, the at least two MLC blocks is five MLC blocks, as described in relation to FIG. 5. Thus, the SLC block is a common SLC block shared by a first set of SLC blocks corresponding to a first MLC block and a second set of SLC blocks corresponding to a second MLC block.

In one embodiment, the allocation circuit 606 allocates one or more SLC blocks to a data stream in response to an MLC block being allocated to the data stream. In certain embodiments, the allocation circuit 606 allocates additional single SLC blocks to the data stream in response to determining, in response to a power cycle occurring, that the additional SLC blocks were previously allocated after information was written to the MIP. In some embodiments, the allocation circuit 606 deallocates one or more SLC blocks from a data stream in response to the data being copied from the one or more SLC blocks to an MLC block and the data in the MLC block being verified.

In certain embodiments, the grouping circuit 608 directs the single level writing circuit 600 to write data corresponding to a first logical group to a set of SLC blocks. In such embodiments, in response to the multi level writing circuit 602 copying data from the set of SLC blocks to MLC blocks, a first portion of data from the set of SLC blocks remains uncopied because the first portion of data is insufficient to fill an entire MLC block. In various embodiments, the hybrid writing component 150 may wait until additional data is available to combine with the first portion of data to fill one or more additional MLC blocks. In some embodiments, the additional data may be part of a same logical group of data, or may be part of a different logical group of data. In certain embodiments, the additional data may be part of a same update group, or may be part of a different update group.

In some embodiments, such as embodiments in which there is one valid logical group and a portion of data remains in an SLC block after copying data to MLC blocks, the grouping circuit 608 may compare the currently open logical group of a primary MLC block to a logical group of data to be stored in an SLC block. If the logical groups are the same, then the data to be stored is added to the SLC block that is partially filled with data as part of the same update group. If the logical groups are not the same, then the open update group is closed and the data to be stored is added to the SLC block as part of a new update group.

In certain embodiments, such as embodiments in which there are two valid logical group and a portion of data remains in an SLC block after copying data to MLC blocks, the grouping circuit 608 may compare the currently open logical group of a primary MLC block to a first logical group of data to be stored in an SLC block. If the logical groups are the same, then the data to be stored is added to the SLC block that is partially filled with data as part of the same update group, then the update group is closed, and a new update group is opened to add data from a second logical group of data to be stored that follows the first logical group of data to be stored. If the logical groups are not the same, then the open update group is closed, the data to be stored is added to the SLC block as part of a new update group, then the new update group is closed, and another update group is opened to add data from a second logical group of data to be stored that follows the first logical group of data to be stored. As may be appreciated, by performing the grouping as described herein, data may be handled with there is insufficient data to evenly match up with an entire SLC block and/or MLC block.

Figure 7:
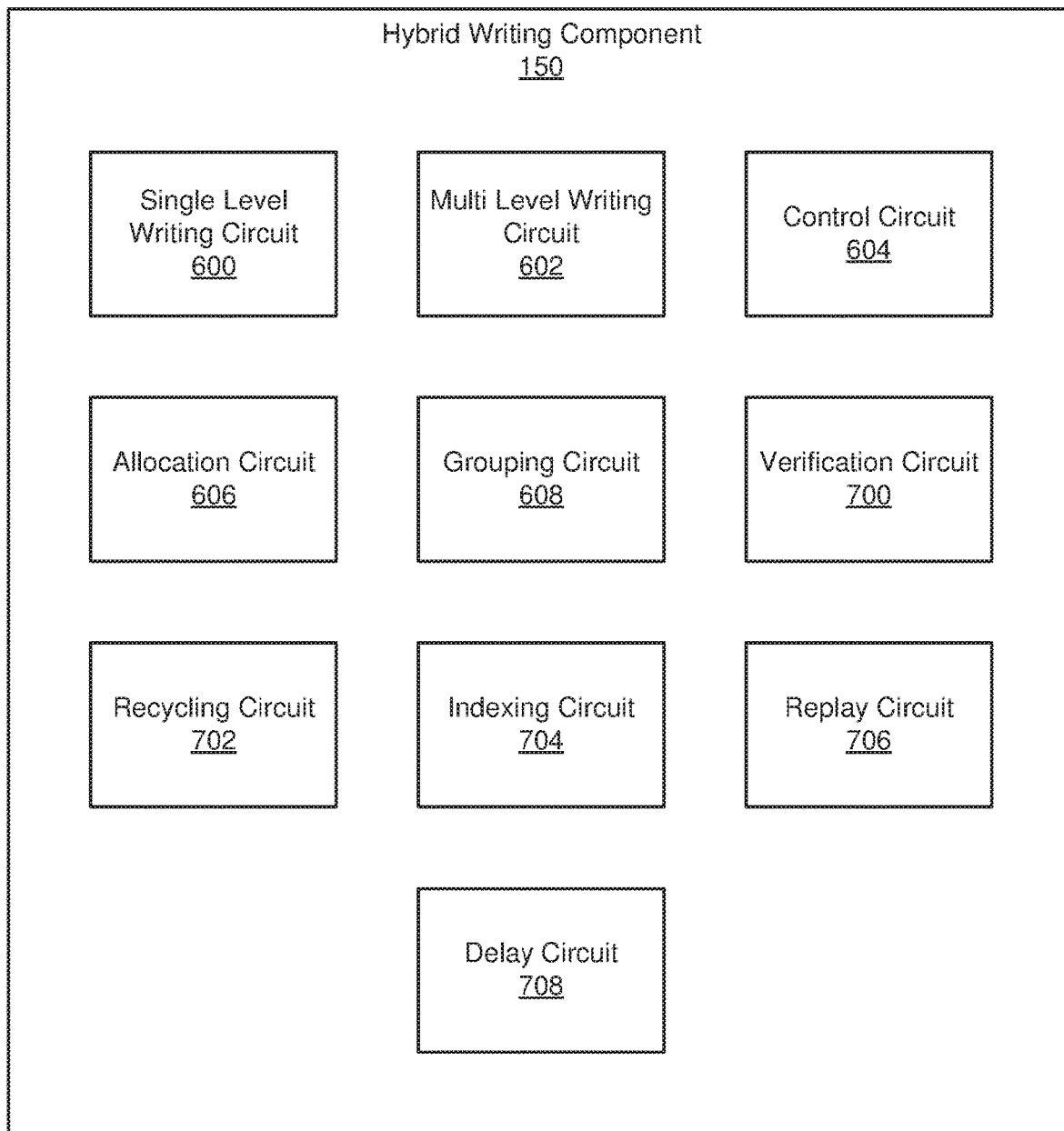
FIG. 7 is a schematic block diagram illustrating another embodiment of a hybrid writing component.

FIG. 7 depicts another embodiment of a hybrid writing component 150. The hybrid writing component 150 may be substantially similar to the hybrid writing component 150 described above with regard to FIGS. 1A, 1B, and/or 6. In general, as described above, the hybrid writing component 150 writes data to a plurality of single level cell blocks, copies the data from the plurality of single level cell blocks to a plurality of multi level cell blocks, controls data to be copied from a single level cell block of the plurality of single level cell blocks to at least two multi level cell blocks of the plurality of multi level cell blocks, allocates a single level cell block of the plurality of single level cell blocks to a first stream in response to a multi level cell block of the plurality of multi level cell block being allocated to the first stream, and/or directs the single level writing circuit to write data corresponding to a first logical group to a set of single level cell blocks of the plurality of single level cell blocks. Accordingly, the hybrid writing component 150 may facilitate writing data in a hybrid dual write environment that uses a combination of SLC blocks and MLC blocks.

In the depicted embodiment, the hybrid writing component 150 includes the single level writing circuit 600, the multi level writing circuit 602, the control circuit 604, the allocation circuit 606, and the grouping circuit 608. The single level writing circuit 600, the multi level writing circuit 602, the control circuit 604, the allocation circuit 606, and the grouping circuit 608 may be substantially similar to the single level writing circuit 600, the multi level writing circuit 602, the control circuit 604, the allocation circuit 606, and the grouping circuit 608 described in relation to FIG. 6. The hybrid writing component 150 also may include a verification circuit 700, a recycling circuit 702, an indexing circuit 704, a replay circuit 706, and/or a delay circuit 708.

In some embodiments, the verification circuit 700 verifies data stored on MLC blocks to ensure that data copied from SLC blocks is stored correctly in the MLC blocks. In certain embodiments, the verification circuit 700 may verify data stored on MLC blocks by testing data stored in the MLC blocks to detect errors. In such embodiments, the verification circuit 700 may not verify the data stored on MLC blocks in response to detecting one or more errors in the data. In various embodiments, a threshold number of errors may be used to determine whether the verification circuit 700 certifies that the data stored in MLC blocks is valid.

In various embodiments, the recycling circuit 702 reuses SLC blocks corresponding to verified MLC blocks. For example, in response to the verification circuit 700 verifying data stored in an MLC block, the SLC blocks that have been fully copied to the MLC block (or any SLC blocks that have been copied to a combination of verified MLC blocks) may be released to be reused for storing more data.

In certain embodiments, the indexing circuit 704 records in an index (e.g., an MIP) information indicating allocation of an SLC block and an MLC block to a data stream in response to the MLC block and/or the SLC block to the data stream. In embodiments that include multiple streams, the indexing circuit 704 may record in the index information indicating allocation of a second SLC block and a second MLC block to a second data stream, and so forth. In various embodiments, the index may include information stored (e.g., dumped, logged) at various times to record major events to facilitate the hybrid writing component 150 reconstructing a state of the non-volatile memory system 102 at a time of a power cycle of the non-volatile memory system 102 in response to the power cycle occurring. As may be appreciated, if too much information is stored in the index, performance of the non-volatile memory system 102 may be adversely impacted during regular operation. In contrast, if too little information is stored in the index, recovery from a power cycle occurring may be adversely impacted. Therefore, to reduce the amount of information stored in the index, and to provide sufficient information in the index, in some embodiments, only one SLC block is initially allocated in response to the allocation of a new MLC block to a stream, and the allocation of the one SLC block and the new MLC block are stored in the index. Thus, because not all SLC blocks allocated to the new MLC block are stored in the index, the amount of information stored in the index is reduced, thereby limiting the impact that storing data in the index has on operation.

In some embodiments, the replay circuit 706 returns a memory device (or non-volatile memory system 102) to a state the memory device was in prior to a power cycle of the memory device occurring. Because the allocation of one SLC block and one MLC block to each data stream is recorded in an index, during replay the replay circuit 706 may have to allocate a maximum of two more SLC blocks to each data stream if the entire SLC blocks are used to store data, or a maximum of three more SLC blocks to each data stream if a portion of the SLC blocks are unavailable for storing data.

In certain embodiments, the replay circuit 706 directs the allocation circuit 606 to allocate additional SLC blocks to a data stream based on data stored in an MLC block. For example, the replay circuit 706 may compare data stored in the MLC block to the data in a corresponding SLC block. By comparing the data stored in the MLC block to the data in the corresponding SLC block, it may be determined if any of the data from the SLC block is copied into the MLC block. As may be appreciated, the data from the SLC block may be in either the upper page, middle page, or lower page of the MLC block. If data has been copied into the MLC block then additional SLC blocks were previously allocated to the MLC block and will need to be reallocated by the allocation circuit 606.

In some embodiments, the replay circuit 706 scans (or searches) a buffer (e.g., SLC FIFO, SLC page buffer 904 in FIG. 9) to determine a number of the additional single level cell blocks to allocate to each data stream. In various embodiments, the replay circuit 706 scan the buffer to determine storage events that occurred after information was written to the index, but before a power cycle of the memory device occurred. In certain embodiments, the replay circuit 706 reads header information of one or more SLC blocks to determine a data stream corresponding to the one or more SLC blocks.

As may be appreciated, data streams may be mixed in a buffer based on data stream allocation to different SLC blocks (e.g., they may not be sequentially allocated to data streams based on their position in the buffer). Accordingly, if the replay circuit 706 is replaying data from the buffer for one data stream and a total number of SLC blocks has not been reached for the data stream, the replay circuit 706 will determine which data stream the next SLC block should be for. If the next SLC block is for a different data stream, then the replay circuit 706 will replay the next SLC block for the different data stream. In various embodiments, the replay circuit 706 may determine which data stream the next SLC block is for based on header data (e.g., metadata) that is part of the next SLC block. In some embodiments, the replay circuit 706 searches a buffer using index information found in the index stored by the indexing circuit 704. The index information may facilitate navigating the buffer to find locations in the buffer in which SLC data for a particular stream starts and/or stops. In certain embodiments, flashware (FW) may be used to store an allocation of what SLC blocks and/or MLC blocks are assigned to each data stream. By using the indexing circuit 704 and/or the replay circuit 706 as described herein, header information for an SLC block may be reduced (e.g., may only include a stream identification value) and/or replay may be simplified.

In various embodiments, the delay circuit 708 may be used to wait a predetermined period of time for additional data to combine with a portion of data that remains after copying data from SLC blocks to MLC blocks. In some embodiments, the delay circuit 708 may pause for a period of time to determine whether additional data is available to combine with a portion of data that remains after copying data from SLC blocks to MLC blocks. In certain embodiments, the portion of data and the additional data may be part of a same logical group; while, in other embodiments, the portion of data and the additional data may be part of a different logical group. In various embodiments, the portion of data and the additional data are part of a same update group; while, in other embodiments, the portion of data and the additional data are part of different update groups.

Figure 8:
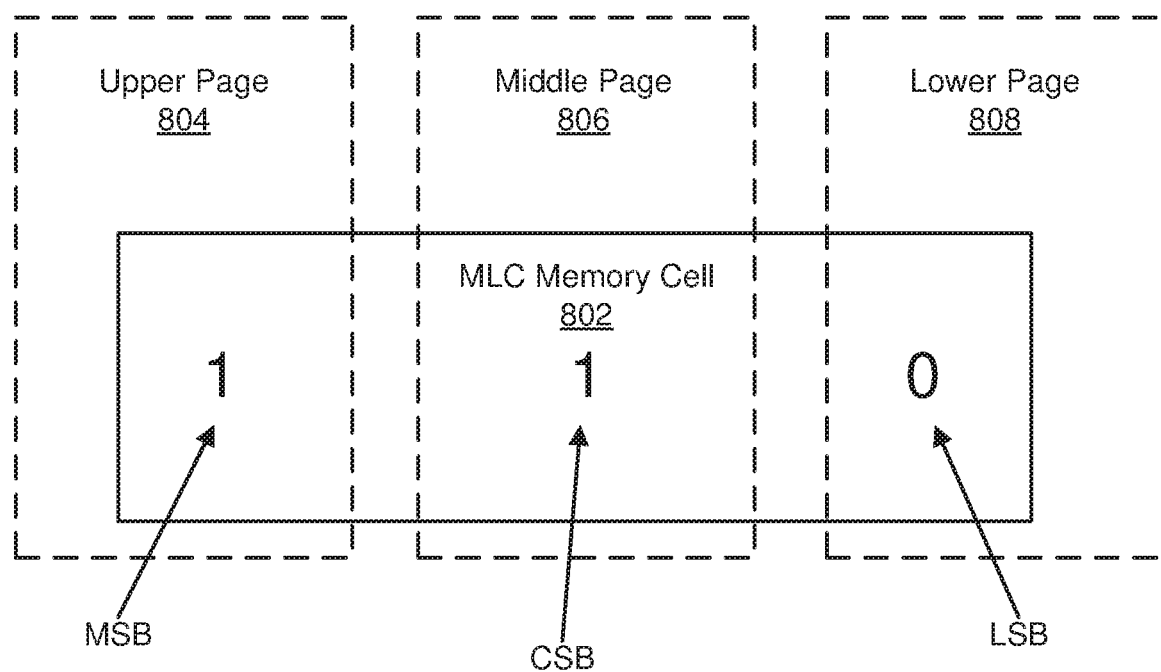
FIG. 8 is a schematic block diagram of an MLC memory cell.

FIG. 8 is a schematic block diagram of an MLC memory cell 802. The MLC memory cell 802 is a cell that has $2^n$ possible states, where n is equal to the number of bits per cell. For example, a MLC memory cell 802 such as the one shown in FIG. 8 may store three bits of information, and accordingly have eight possible states or abodes, as discussed in greater detail below. In other embodiments, an MLC memory cell 802 may store two bits of information, and accordingly have four possible states or abodes; may store four bits of information, and accordingly have sixteen possible states or abodes; or the like.

The MLC memory cell 802 stores at least a most significant bit (MSB), a central significant bit (CSB), and a least significant bit (LSB). In certain embodiments, as shown in FIG. 8, the MSB, CSB, and the LSB, though part of the same physical MLC memory cell 802, may be assigned to different pages of a non-volatile memory media 122. In certain embodiments, a plurality of the MLC memory cells 802 are organized on the non-volatile memory media 122 (such as NAND flash for example) as a page or page tuple. In certain non-volatile memory media 122 comprising a plurality of the MLC memory cells 802 a page is the smallest unit that can be written to the non-volatile memory media 122. In such embodiments, the MLC memory cell 802 may be associated with a page tuple, as described above that includes an upper page 804, a middle page 806, and a lower page 808. The upper page 804 is associated with the MSB, the middle page 806 is associated with the CSB, and the lower page 808 is associated with the LSB. In this manner, the upper page 804, the middle page 806, and the lower page 808 may be associated with or stored by the same, common set of MLC memory cells 802 of the non-volatile memory media 122.

Thus, the MSB, the CSB, and the LSB in the same MLC memory cell 802 may have different addresses in the non-volatile memory device 120. In certain embodiments, the upper page 804 includes the MSBs of a plurality of MLC memory cells 802, the middle page 806 includes the CSBs of a plurality of MLC memory cells 802, and the lower page 808 includes the LSBs of the same MLC memory cells 802. Writes directed to the upper page 804 may therefore cause changes only in the MSBs of the associated MLC memory cells 802, while writes directed to the lower page 808 cause changes only in the LSBs of the associated MLC memory cells 802, and so on for writes to the middle page 806. For MLC memory cells 802 such as NAND flash, writes directed to an upper page 804, a middle page 806, or a lower page 808 may cause changes to only certain of the associated MLC memory cells 802, since an erase operation puts the MLC memory cells 802 in a first logic value state, and the write operation or program operation only changes certain MLC memory cells 802 of a page to the opposite logic value state. Similarly, reads of data stored in the upper page 804 cause reads of the MSBs of multiple MLC memory cells 802, reads of data stored in the middle page 806 cause read of the CSBs of multiple MLC memory cells 802, and reads of data stored in the lower page 808 cause reads of the LSBs of multiple MLC memory cells 802.

In certain embodiments, the data bits are read in response to requests for data that has been stored on the non-volatile memory device 120. Such a request may be referenced as a first read operation. In certain embodiments, the first read operation is directed to the lower page 808 such that only the LSB is returned from the MLC memory cell 802. For example, a storage client 116 (e.g., a file system software application, operating system application, database management systems software application, a client computer, a client device, or the like) may store data on a non-volatile memory device 120. In this example, when the storage client 116 sends a write request, the data is written exclusively to the lower page 808 and/or the middle page 806. As a result, the LSBs and/or the CSBs in the various MLC memory cells 802 are changed, but the MSBs are not changed by the write. Similarly, in this example, when the storage client 116 reads data, the read is directed or addressed to the lower page 808 and/or the middle page 806 and only the LSBs and/or CSBs are read.

Figure 9:
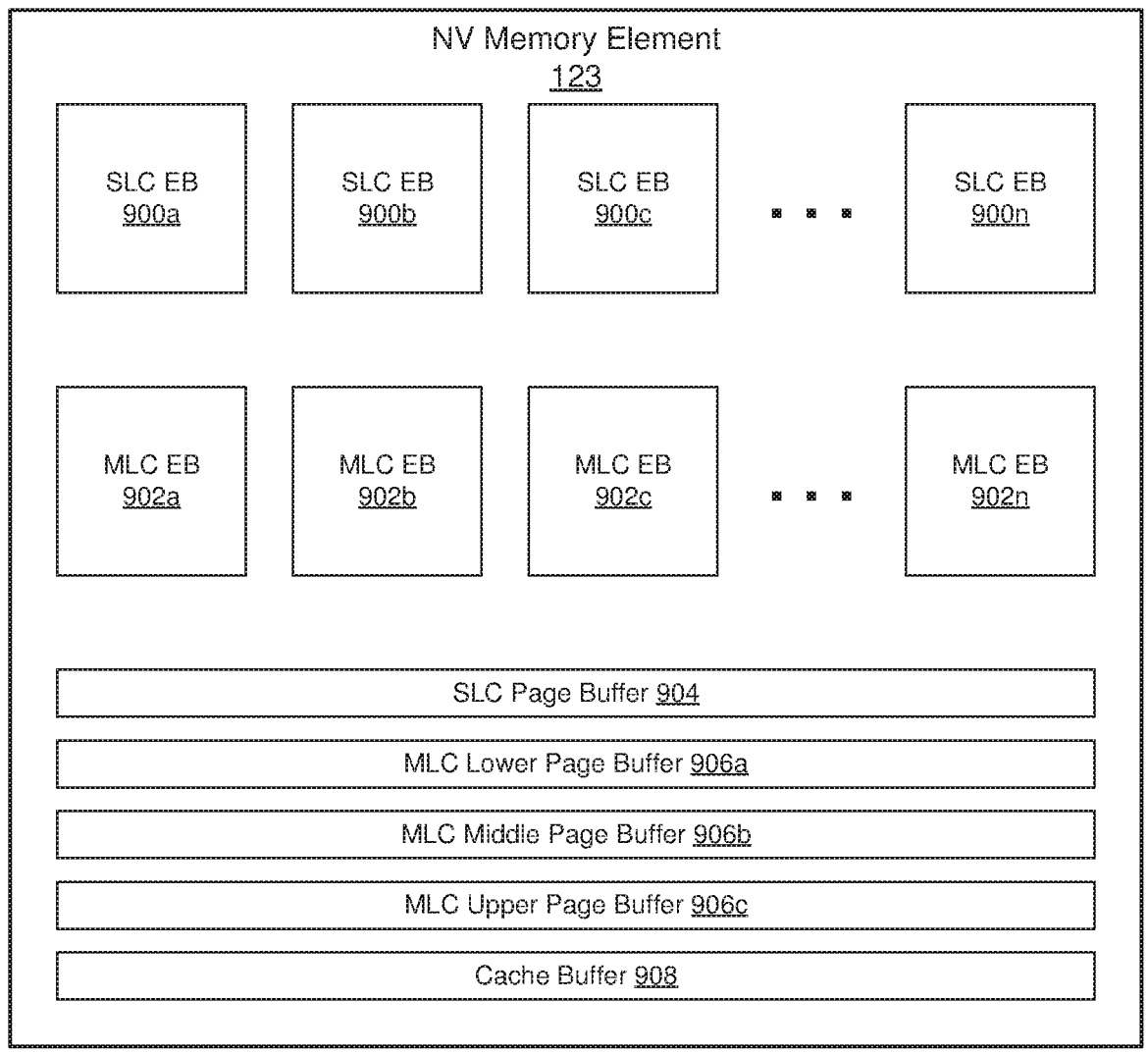
FIG. 9 is a schematic block diagram of a non-volatile memory element.

FIG. 9 is a schematic block diagram of a non-volatile memory element 123. In the depicted embodiment, the non-volatile memory element 123 includes one or more SLC erase blocks (EB) 900a-n, one or more MLC erase blocks 902a-n, an SLC page buffer 904, an MLC lower page buffer 906a, an MLC middle page buffer 906b, an MLC upper page buffer 906c, and a cache buffer 908.

In one embodiment, the hybrid writing component 150 writes data of write requests to the SLC page buffer 904, from which the data is programmed to the one or more SLC erase blocks 900a-n by the single level writing circuit 600. As the hybrid writing component 150 fills the SLC erase blocks 900a-c with data, the multi level writing circuit 602 copies the data to an MLC erase block 902. If the multi level writing circuit 602 determines to internally copy the data from the SLC erase blocks 900a-c to a MLC erase block 902, the multi level writing circuit 602 may load the data, page by page, into the MLC page buffers 906.

The hybrid writing component 150 and/or the recycling circuit 702 may determine whether or not to perform a recycle operation on the SLC erase blocks 900, a portion of the SLC erase blocks 900, or the like that the multi level writing circuit 602 has copied into the MLC erase block 902.

In certain embodiments, the multi level writing circuit 602 writes or programs three pages from the SLC erase blocks 900a-n to an MLC erase block 902 at a time, from the MLC page buffers 906a-c.

Figure 10:
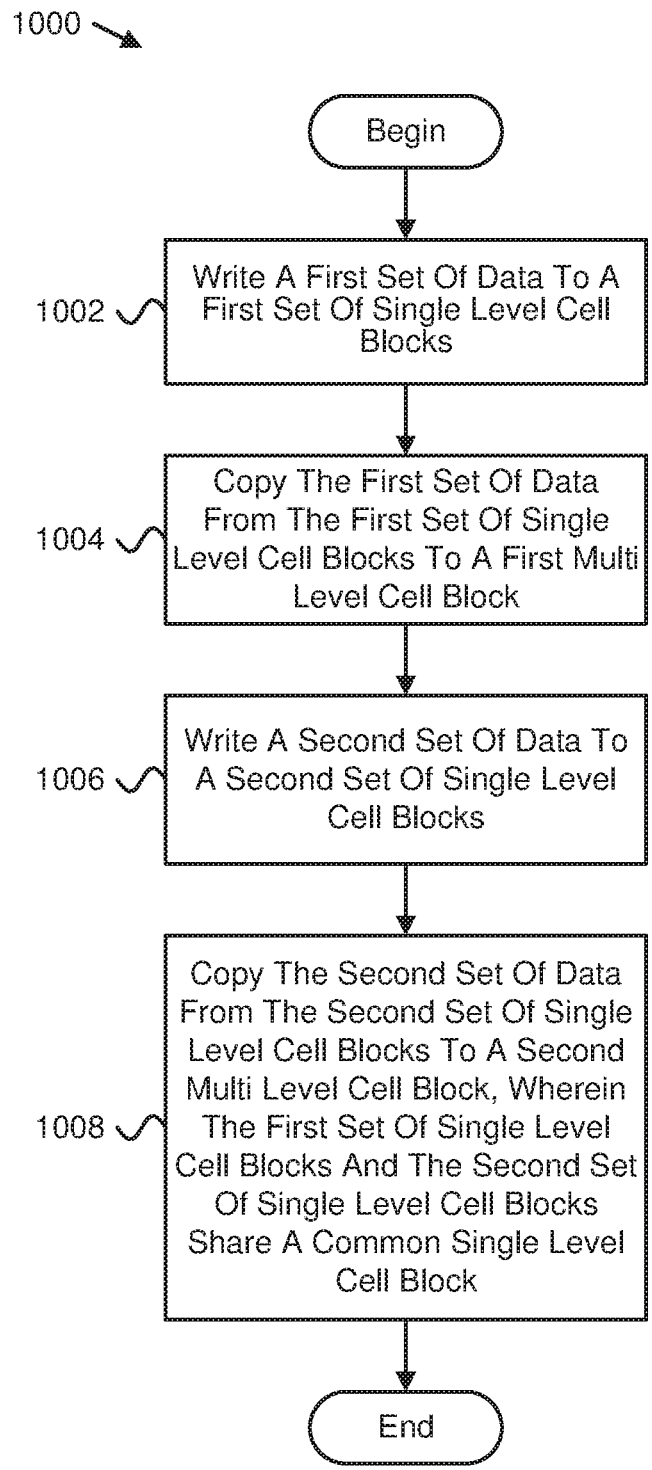
FIG. 10 is a schematic flow chart diagram illustrating one embodiment of a method for hybrid dual write.

FIG. 10 is a schematic flow chart diagram illustrating one embodiment of a method 1000 for hybrid dual write. The method 1000 begins, and the single level writing circuit 600 writes 1002 a first set of data to a first set of single level cell blocks. In one embodiment, the multi level writing circuit 602 and/or the control circuit 604 copies 1004 the first set of data from the first set of single level cell blocks to a first multi level cell block. In certain embodiments, the single level writing circuit 600 writes 1006 a second set of data to a second set of single level cell blocks. In various embodiments, the multi level writing circuit 602 and/or the control circuit 604 copies 1008 the second set of data from the second set of single level cell blocks to a second multi level cell block, and the method 1000 ends. In some embodiments, the first set of single level cell blocks and the second set of single level cell blocks share a common single level cell block.

Figure 11:
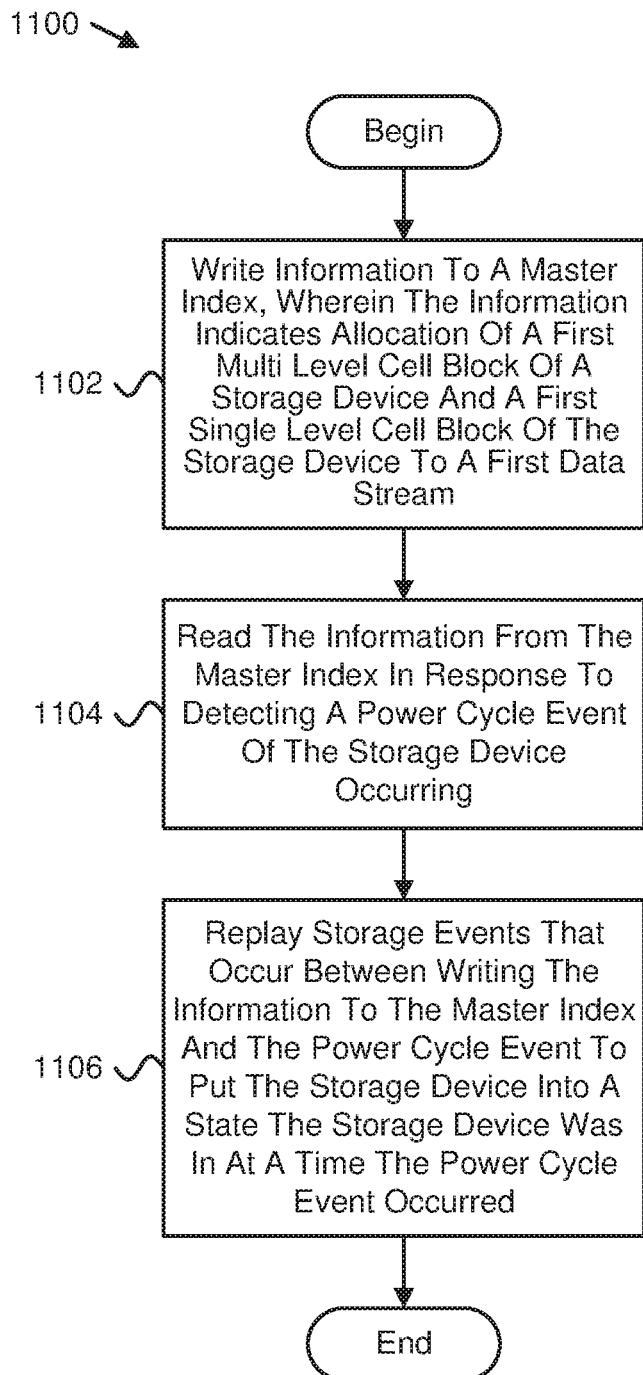
FIG. 11 is a schematic flow chart diagram illustrating another embodiment of a method for hybrid dual write.

FIG. 11 is a schematic flow chart diagram illustrating another embodiment of a method 1100 for hybrid dual write. The method 1100 begins, and the hybrid writing component 150 and/or the indexing circuit 704 writes 1102 information to a master index (e.g., MIP). In certain embodiments, the information indicates allocation of a first multi level cell block of a storage device and a first single level cell block of the storage device to a first data stream. In one embodiment, the hybrid writing component 150 and/or the indexing circuit 704 reads 1104 the information from the master index in response to detecting a power cycle event of the storage device occurring. In various embodiments, the replay circuit 706 replays 1106 storage events that occur between writing the information to the master index and the power cycle event to put the storage device into a state the storage device was in at a time the power cycle event occurred, and the method 1100 ends.

Figure 12:
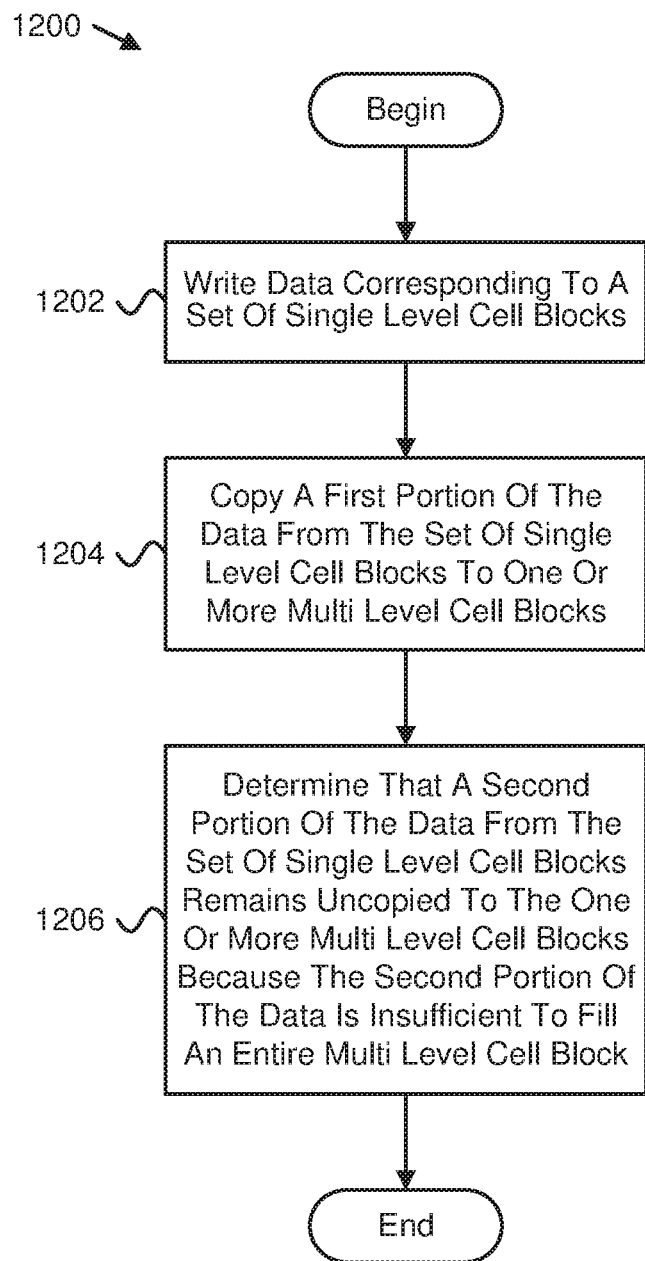
FIG. 12 is a schematic flow chart diagram illustrating a further embodiment of a method for hybrid dual write.

FIG. 12 is a schematic flow chart diagram illustrating a further embodiment of a method 1200 for hybrid dual write. The method 1200 begins, and the single level writing circuit 600 writes 1202 data corresponding to a set of single level cell blocks. In one embodiment, the multi level writing circuit 602 copies 1204 a first portion of the data from the set of single level cell blocks to one or more multi level cell blocks. In certain embodiments, the hybrid writing component 150 determines 1206 that a second portion of the data from the set of single level cell blocks remains uncopied to the one or more multi level cell blocks because the second portion of the data is insufficient to fill an entire multi level cell block, and the method 1200 ends.

A means for storing data in a plurality of single level cell blocks, in various embodiments, may include one or more of a hybrid writing component 150, a single level writing circuit 600, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for storing data in a plurality of single level cell blocks.

A means for copying data from a plurality of single level cell blocks to a multi level cell block, wherein a single level cell block of the plurality of single level cell blocks is configured to store data to be copied to another multi level cell block concurrently with data to be copied to the multi level cell block, in certain embodiments, may include one or more of a hybrid writing component 150, a multi level writing circuit 602, a control circuit 604, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for copying data from a plurality of single level cell blocks to a multi level cell block, wherein a single level cell block of the plurality of single level cell blocks is configured to store data to be copied to another multi level cell block concurrently with data to be copied to the multi level cell block.

A means for storing a portion of data corresponding to a multi level cell block in a single level cell block and storing a portion of data corresponding to another multi level cell block in the single level cell block, in some embodiments, may include one or more of a hybrid writing component 150, a single level writing circuit 600, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for storing a portion of data corresponding to a multi level cell block in a single level cell block and storing a portion of data corresponding to another multi level cell block in the single level cell block.

A means for verifying data in a multi level cell block, in various embodiments, may include one or more of a hybrid writing component 150, a verification circuit 700, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for verifying data in a multi level cell block.

A means for storing index information for a plurality of data streams, in certain embodiments, may include one or more of a hybrid writing component 150, an allocation circuit 606, an indexing circuit 704, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for storing index information for a plurality of data streams.

A means for replaying storage events that occur between a first time at which index information is stored and a second time at which a power cycle occurs at a memory device, in some embodiments, may include one or more of a hybrid writing component 150, a replay circuit 706, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for replaying storage events that occur between a first time at which index information is stored and a second time at which a power cycle occurs at a memory device.

A means for allocating a single level cell block and a multi level cell block to a data stream, in various embodiments, may include one or more of a hybrid writing component 150, an allocation circuit 606, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for allocating a single level cell block and a multi level cell block to a data stream.

A means for determining storage events that occur between a first time and a second time, in certain embodiments, may include one or more of a hybrid writing component 150, a replay circuit 706, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for determining storage events that occur between a first time and a second time.

A means for storing data from different groups in one single level cell block, in some embodiments, may include one or more of a hybrid writing component 150, a single level writing circuit 600, a grouping circuit 608, a delay circuit 708, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for storing data from different groups in one single level cell block. In one embodiment, the different groups include different logical groups.

A means for storing data from different groups in one multi level cell block, in various embodiments, may include one or more of a hybrid writing component 150, a multi level writing circuit 602, a grouping circuit 608, a delay circuit 708, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for storing data from different groups in one multi level cell block. In one embodiment, the different groups include different logical groups.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
a memory device comprising a plurality of single level cell blocks and a plurality of multi level cell blocks; and
a hybrid writing component comprising:
a single level writing circuit that writes data to the plurality of single level cell blocks, wherein:
the plurality of single level cell blocks comprises a first single level cell block, a second single level cell block, and a third single level cell block;
the single level writing circuit writes data for a first multi level cell block of at least two multi level cell blocks of the plurality of multi level cell blocks to the first single level cell block;
the single level writing circuit writes data for a second multi level cell block of the at least two multi level cell blocks to the second single level cell block; and
the single level writing circuit writes data for the first multi level cell block and the second multi level cell block to the third single level cell block;
a multi level writing circuit that copies the data from the plurality of single level cell blocks to the plurality of multi level cell blocks, wherein a number of cells of each single level cell block of the plurality of single level cell blocks is the same as a number of cells of each multi level cell block of the plurality of multi level cell blocks; and
a control circuit that controls data to be copied from:
the entire first single level cell block to the first multi level cell block;
the entire second single level cell block to the second multi level cell block;
a first portion of the third single level cell block to the first multi level cell block; and
a second portion of the third single level cell block to the second multi level cell block, wherein the first portion and the second portion are different, the data copied from the first portion is appended to the first multi level cell block after the data copied from the entire first single level cell block as a result of the entire first single level cell block not filling the first multi level cell block, and the data copied from the second portion is appended to the second multi level cell block after the data copied from the entire second single level cell block as a result of the entire second single level cell block not filling the second multi level cell block.

2. The apparatus of claim 1, wherein the single level writing circuit writes data for one multi level cell block of the plurality of multi level cell blocks to four single level cell blocks of the plurality of single level cell blocks.

3. The apparatus of claim 2, wherein the four single level cell blocks comprises the third single level cell block.

4. The apparatus of claim 1, wherein the multi level writing circuit copies data from three single level cell blocks of the plurality of single level cell blocks entirely to a multi level cell block of the plurality of multi level cell blocks.

5. The apparatus of claim 4, wherein the multi level writing circuit copies a portion of the data from the third single level cell block to the multi level cell block.

6. The apparatus of claim 1, wherein a portion of each single level cell block of the plurality of single level cell blocks is unavailable for storing data.

7. The apparatus of claim 6, wherein the portion comprises 16 pages.

8. The apparatus of claim 1, wherein the hybrid writing component further comprises a verification circuit that verifies the data stored on the plurality of multi level cell blocks.

9. The apparatus of claim 8, wherein the hybrid writing component further comprises a recycling circuit that reuses single level cell blocks of the plurality of single level cell blocks corresponding to verified multi level cell blocks of the plurality of multi level cell blocks.

10. The apparatus of claim 1, wherein the at least two multi level cell blocks comprises five multi level cell blocks.

11. A method comprising:
writing a first set of data to a first set of single level cell blocks;
copying the entire first set of data from the entire first set of single level cell blocks to a first multi level cell block;
writing a second set of data to a second set of single level cell blocks; and
copying the entire second set of data from the entire second set of single level cell blocks to a second multi level cell block, wherein the first set of single level cell blocks and the second set of single level cell blocks share a common single level cell block, and:
  the common single level cell block stores data predetermined to be for the first multi level cell block and the second multi level cell block;
  a first portion of the common single level cell block is copied to the first multi level cell block; and
  a second portion of the common single level cell block is copied to the second multi level cell block, wherein the first portion and the second portion are different, the copied first portion of the common single level cell block is appended to the first multi level cell block after the entire first set of data as a result of the entire first set of data not filling the first multi level cell block, and the copied second portion of the common single level cell block is appended to the second multi level cell block after the entire second set of data as a result of the entire second set of data not filling the second multi level cell block.

12. The method of claim 11, wherein the first set of single level cell blocks and the second set of single level cell blocks each comprise four single level cell blocks, and the common single level cell block is the only single level cell block shared by the first set of single level cell blocks and the second set of single level cell blocks.

13. The method of claim 11, further comprising:
writing a third set of data to a third set of single level cell blocks;
copying the third set of data from the third set of single level cell blocks to a third multi level cell block, wherein the first set of single level cell blocks, the second set of single level cell blocks, and the third set of single level cell blocks share the common single level cell block.

14. The method of claim 13, further comprising:
writing a fourth set of data to a fourth set of single level cell blocks;
copying the fourth set of data from the fourth set of single level cell blocks to a fourth multi level cell block, wherein the first set of single level cell blocks, the second set of single level cell blocks, the third set of single level cell blocks, and the fourth set of single level cell blocks share the common single level cell block.

15. The method of claim 11, wherein part of each single level cell block of the first set of single level cell blocks is unavailable for storing data and part of each single level cell block of the second set of single level cell blocks is unavailable for storing data.

16. The method of claim 11, further comprising testing the data stored in the first multi level cell block to detect errors.

17. The method of claim 16, further comprising, in response to detected errors in the first multi level cell block being below a threshold level, reusing the first set of single level cell blocks to store data.

18. An apparatus comprising:
means for storing data in a plurality of single level cell blocks; and
means for copying data from the plurality of single level cell blocks to a multi level cell block, wherein a single level cell block of the plurality of single level cell blocks is predetermined to store data to be copied to another multi level cell block concurrently with data to be copied to the multi level cell block, and
  a first portion of the single level cell block is copied to the multi level cell block; and
  a second portion of the single level cell block is copied to the another multi level cell block, wherein the first portion and the second portion are different, the data copied from the first portion of the single level cell block is appended to the multi level cell block after the data copied from an entire first single level cell block of the plurality of single level cell blocks as a result of the entire first single level cell block not filling the multi level cell block, and the data copied from the second portion of the single level cell block is appended to the another multi level cell block after other data as a result of the other data not filling the another multi level cell block.

19. The apparatus of claim 18, further comprising means for storing a portion of data corresponding to the multi level cell block in the single level cell block and storing a portion of data corresponding to the another multi level cell block in the single level cell block.

20. The apparatus of claim 18, further comprising means for verifying the data in the multi level cell block.

* * * * *